United States Patent
Jung et al.

(10) Patent No.: US 10,950,561 B2
(45) Date of Patent: Mar. 16, 2021

(54) ANTENNA MODULE

(71) Applicant: SAMSUNG ELECTRONICS CO., LTD., Suwon-si (KR)

(72) Inventors: Hyung Mi Jung, Suwon-si (KR); Kyoung Ok Jung, Suwon-si (KR); Guk Hee Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/282,631

(22) Filed: Feb. 22, 2019

(65) Prior Publication Data

US 2020/0091095 A1 Mar. 19, 2020

(30) Foreign Application Priority Data

Sep. 18, 2018 (KR) .................... 10-2018-0111209

(51) Int. Cl.
*H01L 23/66* (2006.01)
*H01L 23/31* (2006.01)
(Continued)

(52) U.S. Cl.
CPC .......... *H01L 23/66* (2013.01); *H01L 23/3128* (2013.01); *H01L 24/47* (2013.01);
(Continued)

(58) Field of Classification Search
CPC ..... H01L 23/66; H01L 23/3128; H01L 24/47; H01L 2224/04042; H01L 2224/48227;
(Continued)

(56) References Cited

U.S. PATENT DOCUMENTS

2008/0076249 A1  3/2008  Fujii et al.
2012/0280860 A1  11/2012 Kamgaing et al.
(Continued)

FOREIGN PATENT DOCUMENTS

CN  108305856 A  7/2018
CN  108511426 A  9/2018
(Continued)

OTHER PUBLICATIONS

Communication dated May 29, 2019, issued by the Korean Intellectual Property Office in counterpart Korean Patent Application No. 10-2018-0111209.
(Continued)

*Primary Examiner* — Mohammad M Hoque
(74) *Attorney, Agent, or Firm* — Sughrue Mion, PLLC

(57) ABSTRACT

An antenna module includes an antenna substrate including a glass substrate having first and second surfaces opposing each other, an antenna pattern disposed on the first surface, and a wiring structure connected to the antenna pattern and extending to the second surface, and a semiconductor package including a semiconductor chip, having an inactive surface and an active surface, on which a connection pad is disposed, an encapsulant encapsulating the semiconductor chip, a connection member including a redistribution layer connected to the connection pad, and a through-via penetrating the encapsulant and connecting the redistribution layer and the wiring structure to each other.

2 Claims, 14 Drawing Sheets

(51) Int. Cl.
*H01L 23/00* (2006.01)
*H01Q 1/22* (2006.01)

(52) U.S. Cl.
CPC ... *H01Q 1/2283* (2013.01); *H01L 2223/6677* (2013.01); *H01L 2224/04042* (2013.01); *H01L 2224/48227* (2013.01)

(58) Field of Classification Search
CPC . H01L 2223/6677; H01L 24/20; H01L 25/16; H01L 25/18; H01L 23/15; H01L 23/49816; H01L 23/5389; H01L 2224/18; H01Q 1/2283; H01Q 21/0093; H01Q 21/065; H01Q 23/00; H01Q 1/38; H01Q 1/242; H01Q 1/50
USPC ........................................................ 257/728
See application file for complete search history.

(56) References Cited

U.S. PATENT DOCUMENTS

| | | |
|---|---|---|
| 2013/0009320 A1 | 1/2013 | Yoo et al. |
| 2013/0141284 A1 | 6/2013 | Jeong |
| 2014/0247195 A1 | 9/2014 | Yen |
| 2014/0293529 A1* | 10/2014 | Nair ..................... H01Q 1/2291 361/679.31 |
| 2015/0070228 A1 | 3/2015 | Gu et al. |
| 2015/0194388 A1* | 7/2015 | Pabst ................. H01L 23/3128 257/659 |
| 2015/0348920 A1* | 12/2015 | Yap ..................... H01L 21/768 257/664 |
| 2017/0040266 A1* | 2/2017 | Lin ..................... H01L 23/5383 |
| 2017/0048981 A1* | 2/2017 | Hu ........................ H01L 25/117 |
| 2017/0154859 A1 | 6/2017 | Yap et al. |
| 2018/0145033 A1 | 5/2018 | Yi et al. |
| 2018/0247905 A1 | 8/2018 | Yu et al. |
| 2018/0342788 A1* | 11/2018 | Lasiter ..................... H01Q 1/46 |
| 2019/0027804 A1 | 1/2019 | Kim et al. |
| 2019/0157206 A1* | 5/2019 | Wang ..................... H01L 23/66 |
| 2019/0173184 A1 | 6/2019 | Kim et al. |
| 2019/0189572 A1* | 6/2019 | Chiang ............... H01L 23/5383 |
| 2019/0288373 A1 | 9/2019 | Chen et al. |
| 2019/0371694 A1* | 12/2019 | Hsu ................... H01L 21/76816 |
| 2020/0006846 A1* | 1/2020 | Lasiter ................... H01Q 9/285 |

FOREIGN PATENT DOCUMENTS

| | | |
|---|---|---|
| JP | 2008-078207 A | 4/2008 |
| KR | 10-2014-0014259 A | 2/2014 |
| KR | 10-2018-0058095 A | 5/2018 |
| KR | 10-2019-0009232 A | 1/2019 |
| KR | 10-2019-0066939 A | 6/2019 |
| TW | 201622503 A | 6/2016 |

OTHER PUBLICATIONS

Communication dated Mar. 3, 2020, issued by the Taiwan Patent Office in counterpart Taiwan Application No. 108105354.
Communication dated Sep. 24, 2020 by the State Intellectual Property Office of P.R. China in counterpart Chinese Patent Application No. 201910333887.9.

* cited by examiner

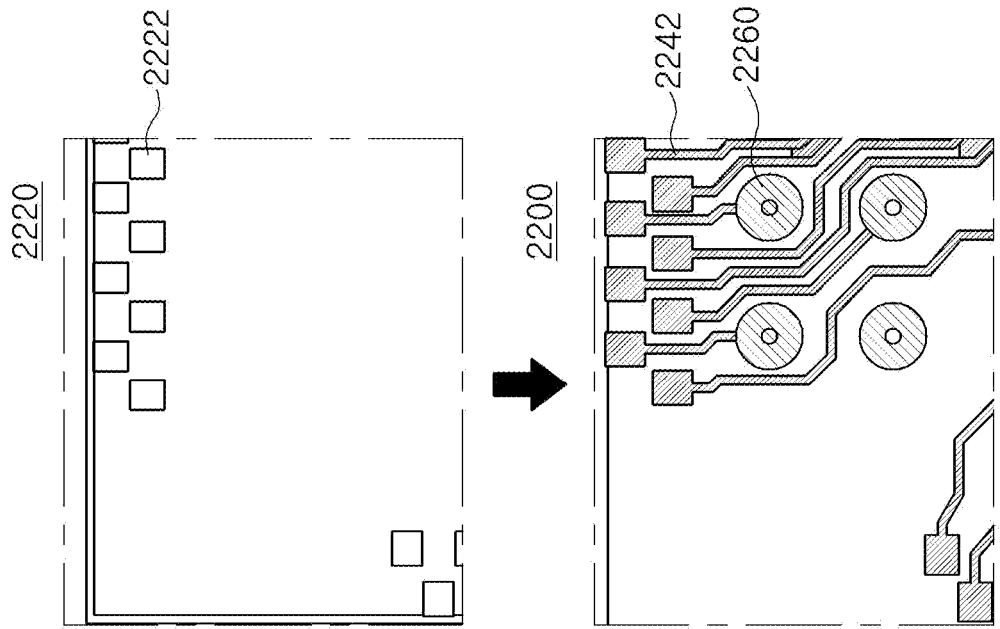
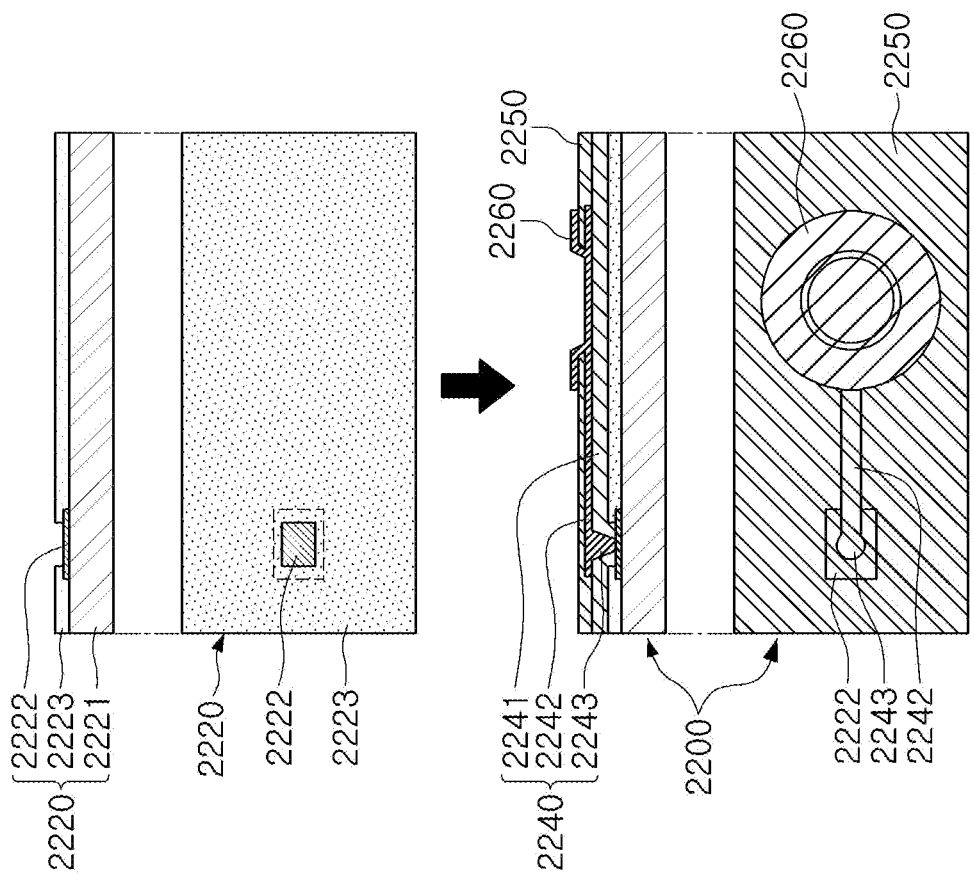
FIG. 3B
FIG. 3A

I-I'

ANTENNA MODULE

CROSS-REFERENCE TO RELATED APPLICATION(S)

This application claims benefit of priority to Korean Patent Application No. 10-2018-0111209 filed on Sep. 18, 2018 in the Korean Intellectual Property Office, the disclosure of which is incorporated herein by reference in its entirety.

TECHNICAL FIELD

The present disclosure relates to an antenna module including a semiconductor chip.

BACKGROUND

With the recent trend for the thinning of electronic devices, various components mounted on a mobile device, such as a smartphone, need to be miniaturized. Accordingly, when an antenna module for millimeter wave (mmWave) and 5th generation (5G) communications is applied to a mobile device, there are many limitations on the size and thickness of the antenna module to secure the degree of freedom of a mounting position in a set and to significantly reduce a process.

SUMMARY

An aspect of the present disclosure is to provide an antenna module for reducing signal loss to ensure high-frequency performance.

According to an aspect of the present disclosure, an antenna module includes an antenna substrate including a glass substrate having first and second surfaces opposing each other, an antenna pattern disposed on the first surface, and a wiring structure connected to the antenna pattern and extending to the second surface, and a semiconductor package including a semiconductor chip, having an active surface, on which a connection pad is disposed, and an inactive surface disposed on the second surface of the glass substrate and opposing the active surface, an encapsulant encapsulating the semiconductor chip, a connection member including a redistribution layer connected to the connection pad, and a through-via penetrating the encapsulant and connecting the redistribution layer and the wiring structure of the antenna substrate to each other.

According to an aspect of the present disclosure, an antenna module includes an antenna substrate including a glass substrate having first and second surfaces opposing each other, an antenna pattern disposed on the first surface, a wiring pattern disposed on the second surface, and a first through-via connecting the antenna pattern and the wiring pattern to each other, and a semiconductor package disposed on the antenna substrate. The semiconductor package includes a first connection structure, disposed on the second surface of the glass substrate, including a first redistribution layer connected to the wiring pattern, a semiconductor chip, disposed on the first connection member, including a connection pad connected to the first redistribution layer, an encapsulant disposed on the first connection member and encapsulating the semiconductor chip, a second connection member, disposed on the encapsulant, including a second redistribution layer, and a second through-via penetrating the encapsulant and connecting the first redistribution layer and the second redistribution layer to each other.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A and 3B are schematic cross-sectional views illustrating states of a fan-in semiconductor package before and after being packaged;

FIG. 10A is a sectional plan view taken along line I-I' in FIG. 9, while

DETAILED DESCRIPTION

Hereinafter, embodiments of the present disclosure will be described as follows with reference to the attached drawings.

Electronic Device

Figure 1:
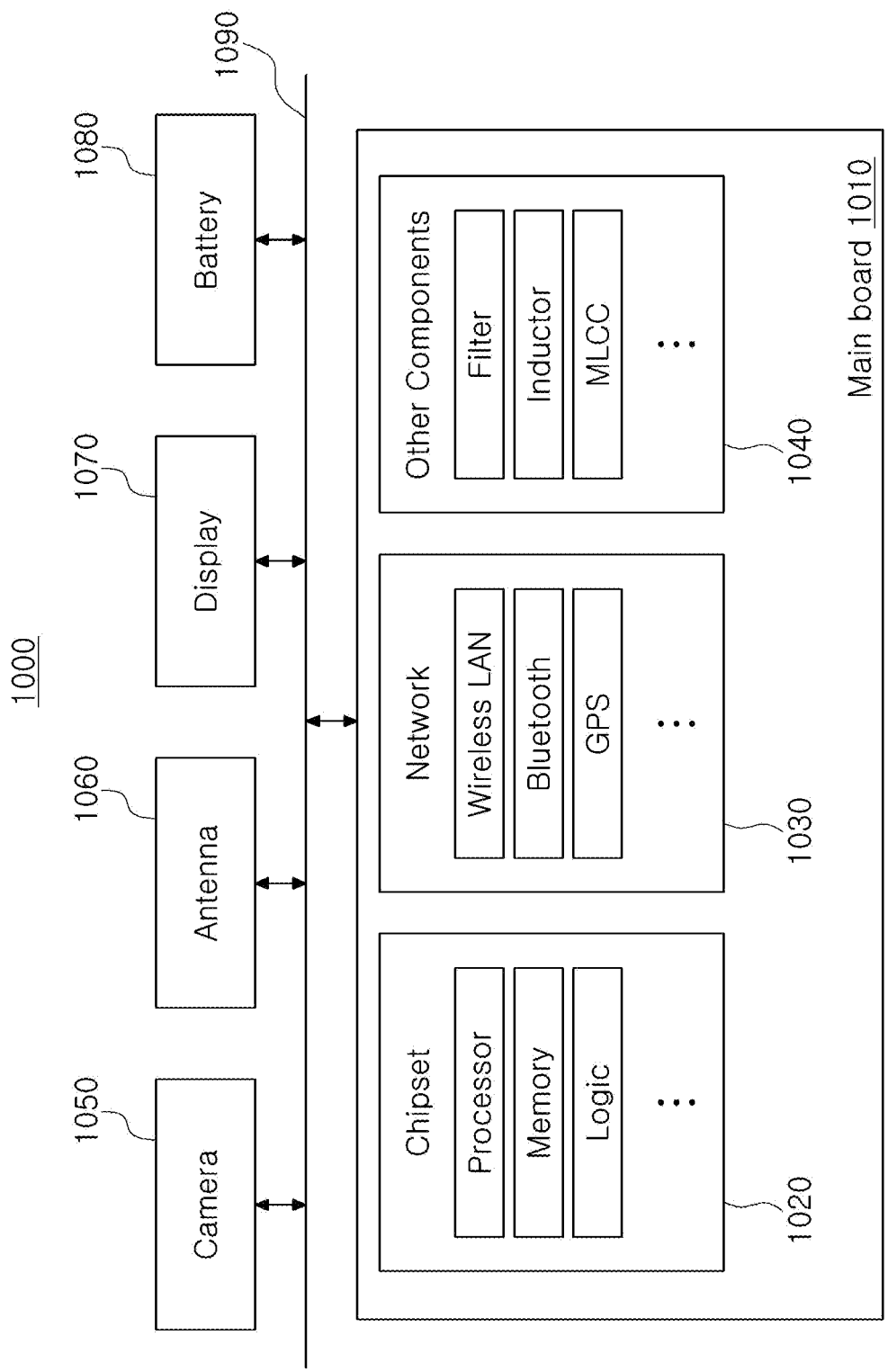
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
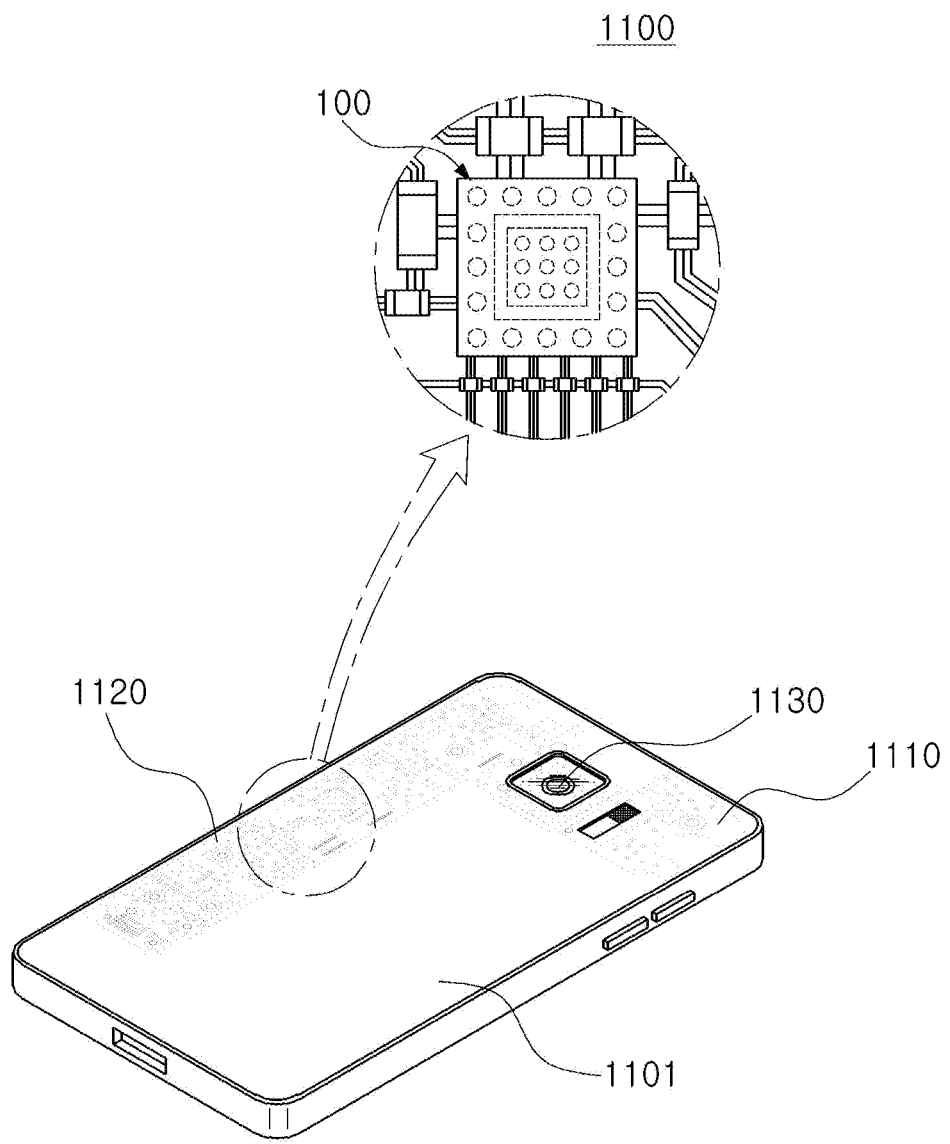
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 4:
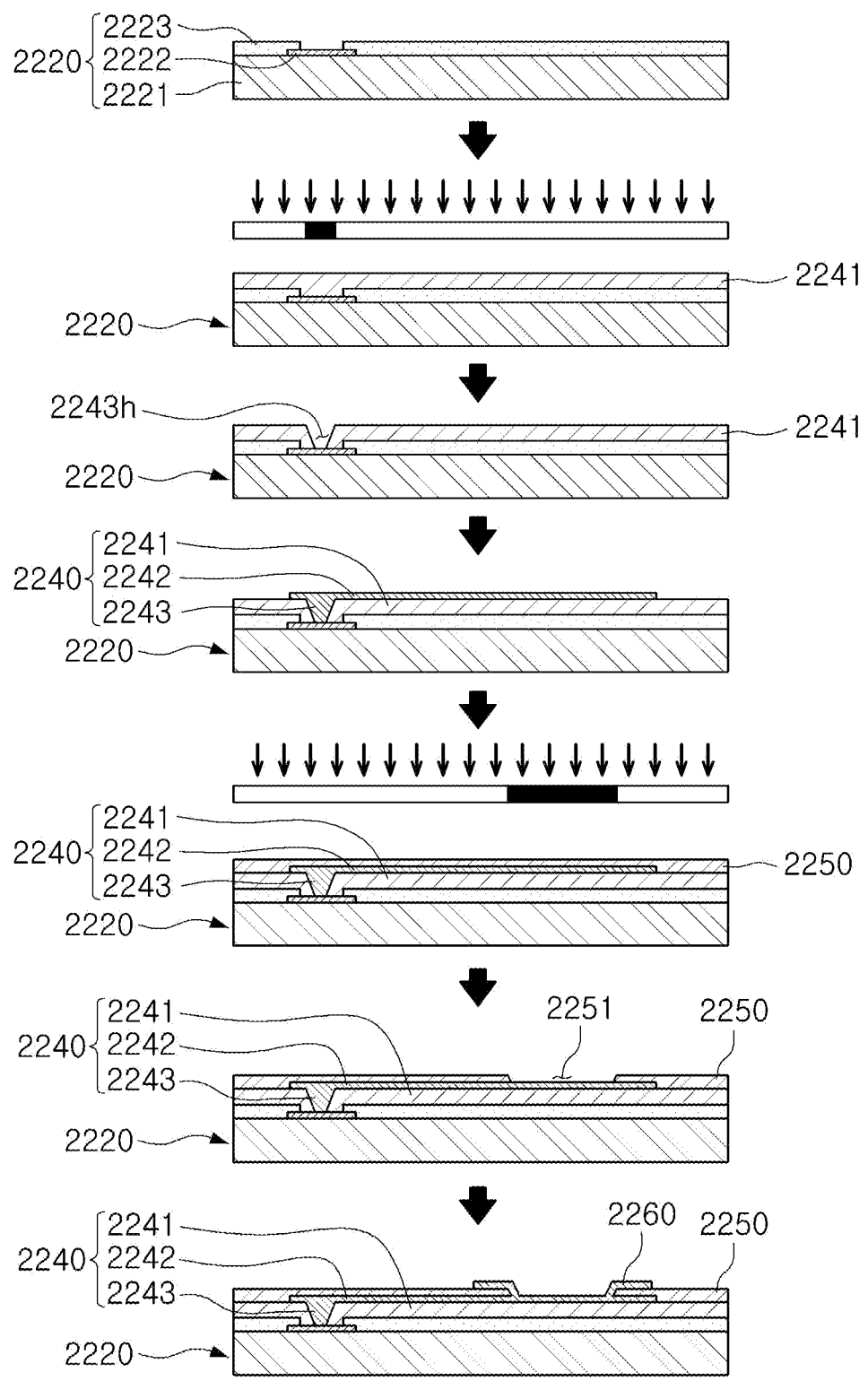
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
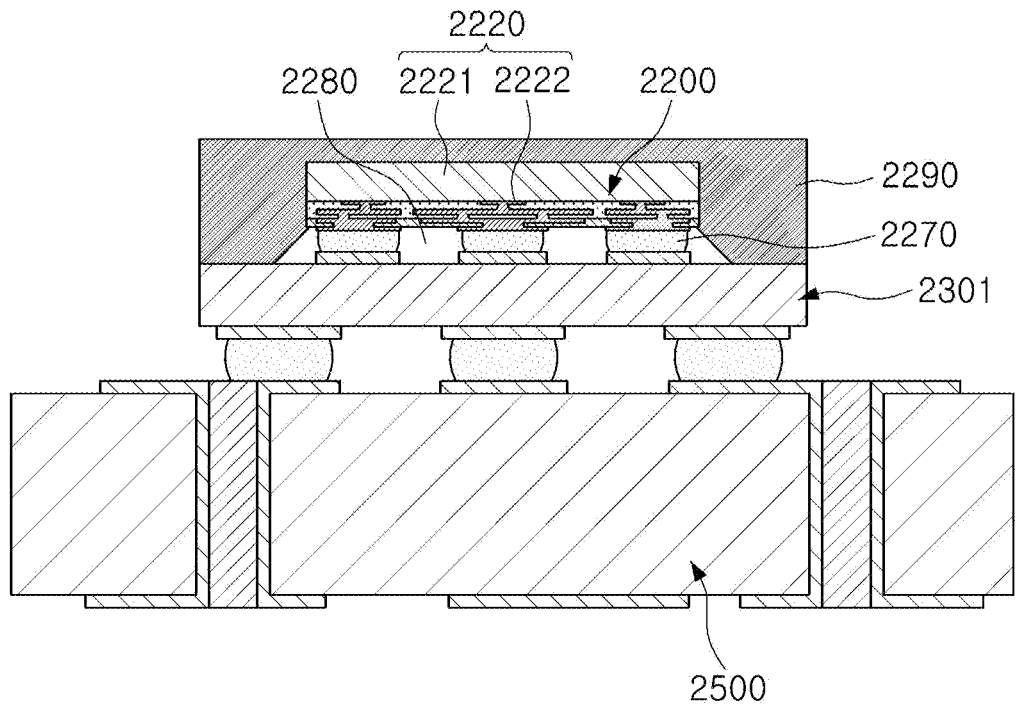
FIG. 5 is a schematic cross-sectional view illustrating a case in which a fan-in semiconductor package is mounted on an interposer substrate and is ultimately mounted on a mainboard of an electronic device.
Figure 6:
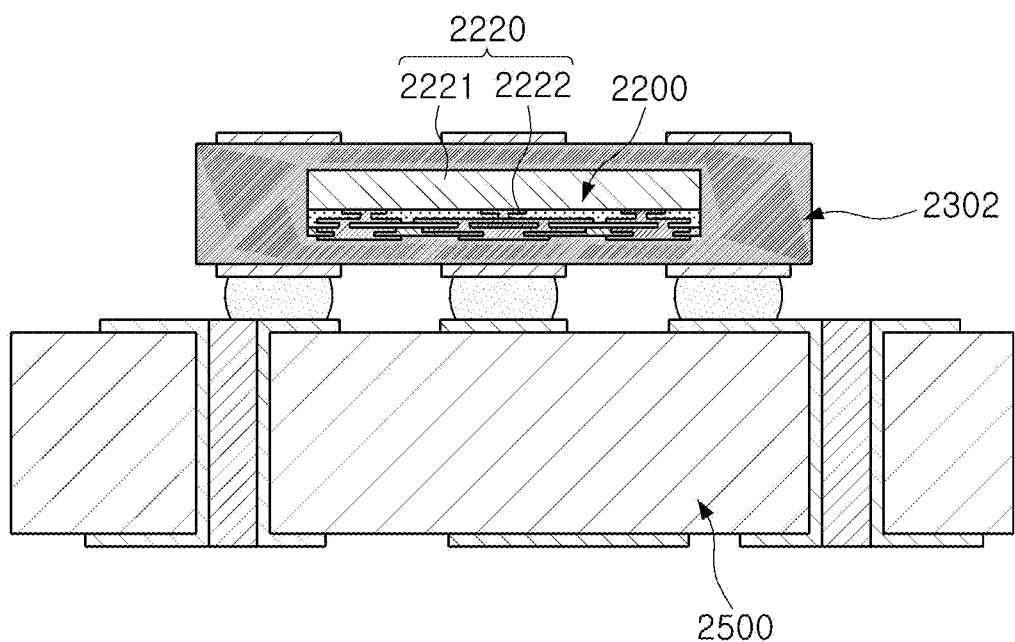
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
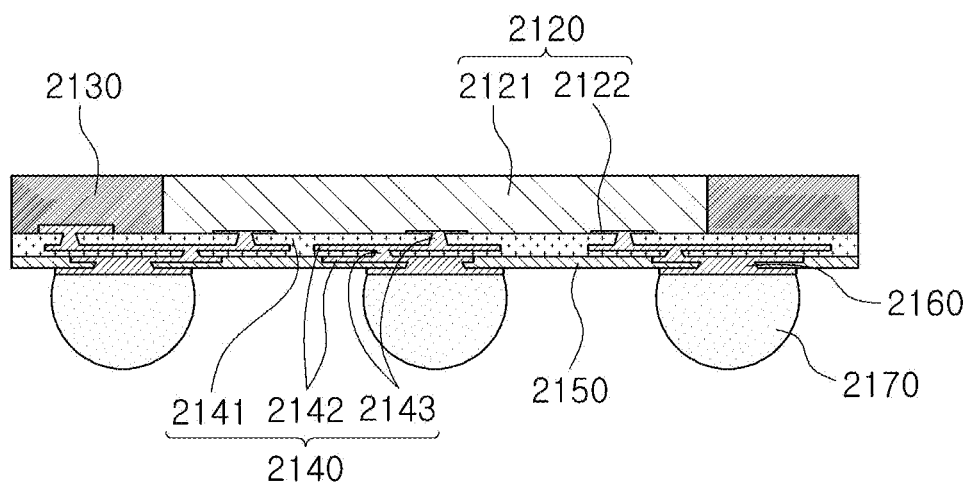
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
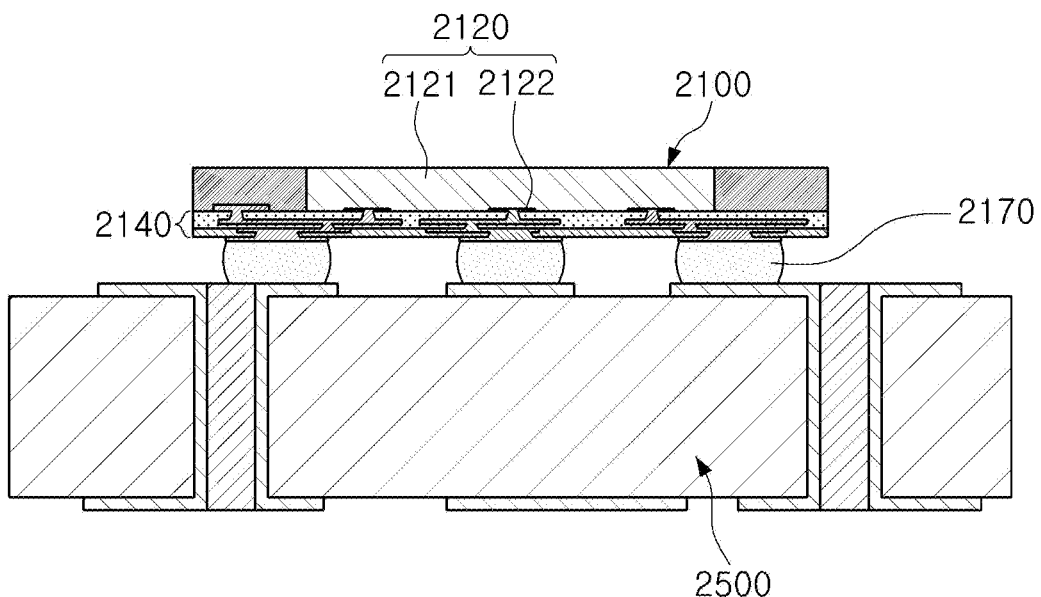
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
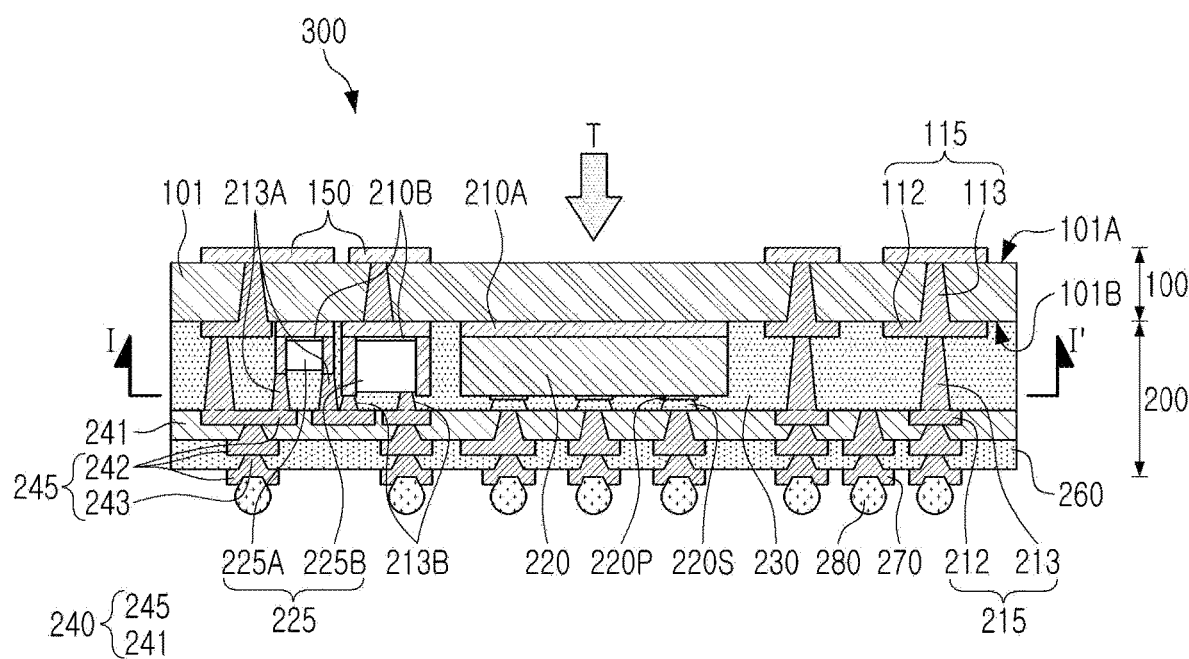
FIG. 9 is a schematic cross-sectional view illustrating an antenna module according to an exemplary embodiment in the present disclosure.
Figure 10A:
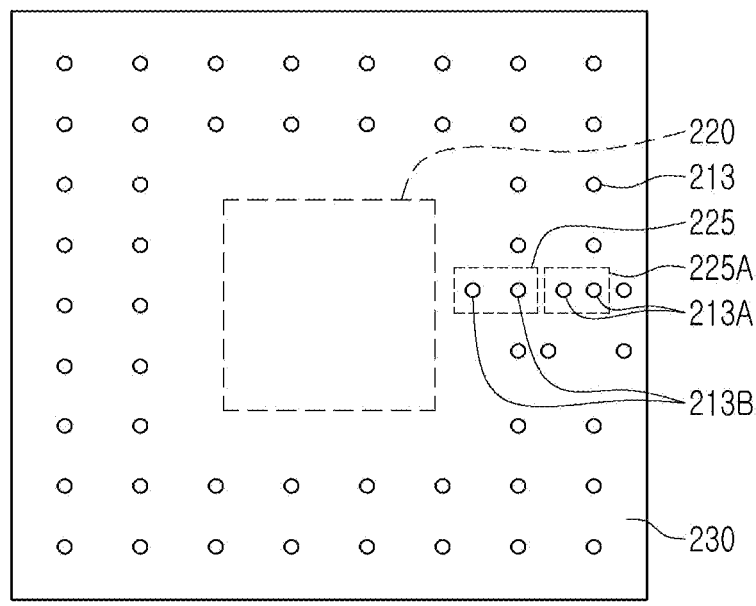

FIG. 9 is a schematic cross-sectional view illustrating an antenna module according to an exemplary embodiment in the present disclosure, and FIG. 10A is a sectional plan view taken along line I-I' in FIG. 9.

Referring to FIGS. 9 and 10A, an antenna module 300 according to an exemplary embodiment includes an antenna substrate 100 having an antenna pattern 150, and a semiconductor package 200 having a semiconductor chip 220.

The antenna substrate 100 includes a glass substrate 101, having a first surface 101A on which the antenna patterns 150 and a second surface 101B opposing the first surface 101A, and a wiring structure 115 connected to the antenna pattern 105 to extend to the second surface 101B.

Since the glass substrate 101 adopted in the present embodiment is formed of a glass having a low dielectric constant $D_k$ and a low dielectric loss factor $D_f$, transmission loss of the antenna module 300 may be significantly reduced and transmission and reception rates may be improved. Moreover, since a surface of the glass substrate 101 has relatively low illuminance, loss caused by a skin effect may be reduced.

The wiring structure 115 may include a wiring pattern 112, disposed on the second surface 101B, and a first through-via 113 connecting the antenna pattern 150 and the wiring pattern 112 to each other.

Figure 10B:
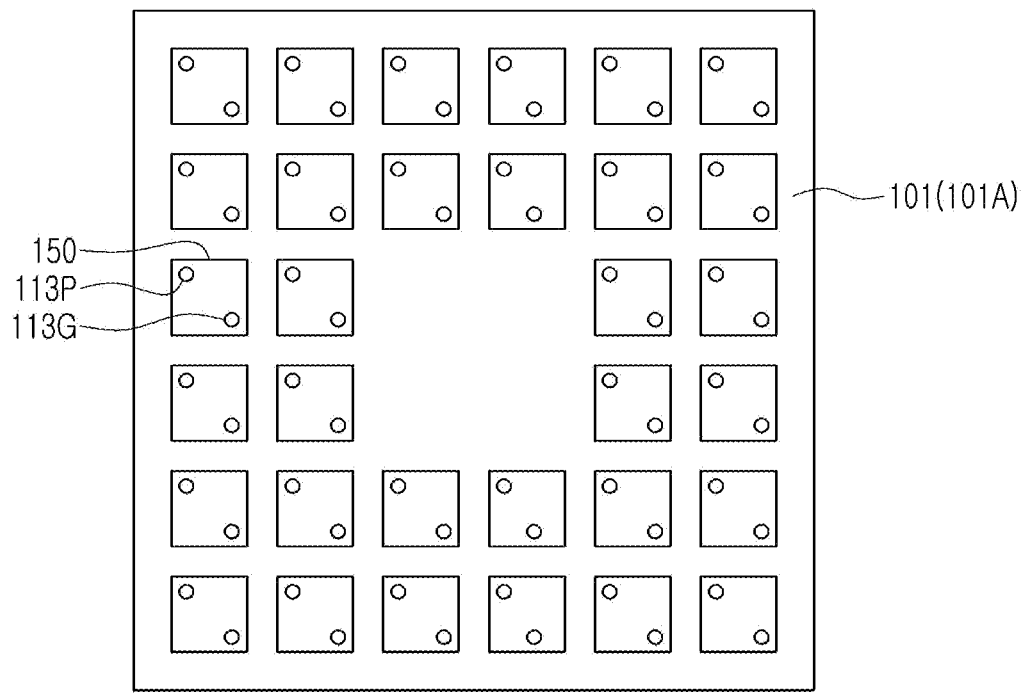
FIG. 10B is a plan view illustrating an antenna pattern arrangement of the antenna module in FIG. 9.

FIG. 10B is a plan view illustrating an antenna pattern arrangement of the antenna module in FIG. 9 (a view in a thickness direction of FIG. 9, i.e., a vertical direction in FIG. 9 perpendicular to the first surface 101A or the second surface 101B).

Referring to FIG. 10B together with FIG. 9, the antenna pattern 150 may include a plurality of antenna patterns 150 arranged on the first surface 101A of the glass substrate 101. For example, the plurality of antenna patterns 150 may be disposed in two rows along a corner of the glass substrate 101, but the arrangement thereof is not limited thereto. First through-vias 113 may be connected to the respective antenna patterns 150 in pair to be provided as a feeder via 113P, connected to a feeder circuit, and a ground via 113G connected to a ground portion.

As illustrated in FIG. 9, the semiconductor package 200 includes an encapsulant 230 configured to encapsulate the semiconductor chip 220, a connection member 240 including a redistribution layer 245 connected to the semiconductor chip 220, and a second through-via 213 formed to penetrate the encapsulant 230. Since the encapsulant 230 is disposed on the second surface 101B of the glass substrate 101, the semiconductor package 200 may be integrated with the antenna substrate 100.

The semiconductor chip 220 may have an inactive surface disposed on the second surface 101B of the glass substrate 101 and an active surface, opposing the inactive surface, on which a connection pad 220P is disposed. As described above, the semiconductor chip 220 adopted in the present embodiment may be mounted in a face-up manner on the basis of the glass substrate 101.

The semiconductor package 200 may further include a first bonding layer 210A configured to bond the inactive surface of the semiconductor chip 220 to the second surface 101B of the glass substrate 101. For example, the first bonding layer 210A may include an adhesive film such as a die attach film (DAF).

The second through-via 213 may penetrate the encapsulant 230 to connect the redistribution layer 245 to the wiring structure 115 (in detail, the wiring pattern 112). The second through-via 213 may have a smaller area closer to the glass substrate 101. Such a shape is made because the glass substrate 101 used as an antenna substrate is used as a carrier substrate during a module manufacturing process, which will be described later in detail in a module manufacturing process of FIGS. 11A to 11F.

The connection member 240 may oppose a surface brought into contact with the second surface 101B of the glass substrate 101. The connection member 240 includes an insulating layer 241 and a redistribution layer 245 disposed on the insulating layer 241, and is electrically connected to the connection pad 220P of the semiconductor chip 220. In the present embodiment, the connection pad 220P of the semiconductor chip 220 may be connected to the redistribution layer 245 by a conductive bump 220S, but is not limited thereto.

The redistribution layer 245 may include a redistribution pattern 242 and a redistribution via 243. In the present embodiment, the redistribution pattern 242 includes a first redistribution pattern (also referred to as a 'wiring pattern'), disposed on a surface of the encapsulant 230 to be connected to the second through-via 213, and a second redistribution pattern disposed on the insulating layer 241. The redistribution via 243 may penetrate the insulating layer 241 to connect the first and second redistribution patterns. Similarly to the second through-via 213, the redistribution via 243 may have a smaller area closer to the glass substrate 101.

The semiconductor package 200 includes at least one passive component 225 disposed on the second surface 101B of the glass substrate 101 to be encapsulated by the encapsulant 230. In the present embodiment, the at least one passive component 225 may include a plurality of passive components 225A and 225B such as an inductor and a capacitor. The plurality of passive components 225A and 225B may be connected to the redistribution layer 245. More specifically, connection vias 213A and 213B may be formed in the encapsulant 230 to connect the plurality of passive components 225A and 225B to the redistribution layer 245. The connection via 213A and 231B may be formed during a process of forming the second through-via 213. For example, by adjusting laser output and/or time to vary via depth, the second through-via 213 and the connection vias 213A and 213B may be formed in desired positions.

The semiconductor package 200 may include a second bonding layer 210B configured to bond one surface of the plurality of passive components 225A and 225B to the second surface 101B of the glass substrate 101. For example, similarly to the first bonding layer 225A, the second bonding layer 210B may include an adhesive film such as a DAF. Since the glass substrate 101 is used as a carrier substrate, the inactive surface of the semiconductor chip 220 may be substantially coplanar with a bonded surface of the plurality of passive components 225A and 225B.

Hereinafter, main components of the antenna module 300 according to an exemplary embodiment will be described in further detail.

The semiconductor chip 220 may be formed based on an active wafer. The semiconductor chip 220 for use in an antenna module may include a radio-frequency integrated circuit (RFIC) chip. A body of the semiconductor chip 220 may contain silicon (Si), germanium (Ge), and gallium-arsenide (GaAs). The connection pad 220P is provided to electrically connect the semiconductor chip 220 to another component, and may be formed of a metal such as aluminum (Al).

The semiconductor chip 220 may be provided as an integrated circuit (IC) in which hundreds to millions of devices are integrated in a single chip. For example, the IC may be provided as an application processor chip, such as a central processor (for example, a CPU), a graphics processor (for example, a GPU), a field programmable gate array (FPGA), a digital signal processor, a cryptography processor, a microprocessor, a microcontroller, or the like, and, in detail, may be an application process (AP), but is not limited thereto. The semiconductor chip 220 may be a logic chip such as an analog-to-digital converter, an application-specific integrated circuit (ASIC), or the like, or the like, or a memory chip such as a volatile memory (for example, a DRAM), a nonvolatile memory (for example, a ROM), a flash memory, or the like. In addition, it will be appreciated that the chips may be combined with each other.

The encapsulant 230 may be provided to protect the electronic component 220. A shape of encapsulation is not limited, but the encapsulant 230 may have any shape as long as the encapsulant 230 surrounds at least a portion of the semiconductor chip 220. For example, the encapsulant 230 may be disposed to cover at least a portion of the semiconductor chip 220. A specific material of the encapsulant 230 is not limited, and various insulating materials may be used as the material of the encapsulant 230. The insulating material may include a thermosetting resin such as an epoxy resin, a thermoplastic resin such as polyimide, resins in which a reinforcing material, such as an inorganic filler, is impregnated in the thermosetting resin and the thermoplastic resin. For example, an Ajinomoto build-up film (ABF), FR-4, a bismaleimide triazine (BT) resin, a photoimageable dielectric (PID) resin, or the like, may be used as the insulating material. In addition, a molding material, known in the art, such as an epoxy molding compound (EMC), or the like, may also be used. If necessary, resins, in which a reinforcing material, such as glass fiber or an inorganic filler, is impregnated in the thermosetting resin and the thermoplastic resin, may be used.

As described above, the connection member 240 may include a redistribution layer 245 to redistribute the connection pad 220P of the semiconductor chip 220. The insulating layer 241 of the connection member 240 may include the above-mentioned insulating materials. In a certain embodiment, the insulating layer 241 may include an insulating material such as a photoimageable dielectric (PID) resin. For example, the redistribution layer 245 may include copper (Cu), aluminum (Al), silver (Ag), tin (Sn), gold (Au), nickel (Ni), lead (Pb), titanium (Ti), or alloys thereof. The redistribution layer 245 may perform various functions depending on a design of the corresponding layer. For example, the redistribution layer 245 may include a ground (GND) pattern, a power (PWR) pattern, a signal (S) pattern, or the like.

The connection member 240 may be configured to redistribute the connection pad 220P of the semiconductor chip 220. Several tens or several hundreds of connection pads 122 having various functions may be redistributed through the second connection member 240, and may be physically and/or electrically connected externally, according to a function thereof, through an electrical connection metal 280.

The passivation layer 260 is configured to protect the connection member 240 from an external physiochemical damage or the like. The passivation layer 260 may have several tens or several thousands of openings to expose at least a portion of the redistribution layer 245. A material of the passivation layer 260 is not limited. For example, a photoimageable dielectric (PID) material such as a PID resin or a solder resist may be used as a material of the passivation layer 260. Alternatively, an insulating resin, in which an inorganic filler is mixed, for example, ABF or the like may be used as a material of the passivation layer 260.

An under-bump metallization (UBM) layer 270 may improve connection reliability of the electrical connection metal 280 to improve board-level reliability of the antenna module 300. As described above, the UBM layer 270 is disposed on the passivation layer 260 and is connected to the redistribution pattern 242 of the connection member 240. The electrical connection metal 280 may physically and/or electrically connect the antenna module 300 to an external device. For example, the antenna module 300 is mounted on a mainboard of an electronic device through an electrical connection member 28.

The electrical connection metal 280 is used as a connection terminal to physically and/or electrically connect the antenna module 300 to an external device. A conductive metal, for example, a low-melting point alloy such as Sn—Al—Cu may be used as a material of the electrical connection metal 280. The electrical connection metal 280 may be a land, a ball, a pin, or the like. The electrical connection metal 280 may include multiple layers or a single layer.

The number, an interval, a disposition form, and the like, of electrical connection metals 280 are not limited, but may be sufficiently modified, depending on design particulars by those skilled in the art. At least one of the electrical connection metals 280 may be disposed in a fan-out region.

The term "fan-out region" refers to a region except for the region in which the semiconductor chip 220 is disposed. The fan-out package may have excellent reliability as compared to a fan-in package, may implement a plurality of input/output (I/O) terminals, and may facilitate a 3D interconnection. Unlike a ball grid array (BGA) package and a land grid array (LGA) package, the fan-out package may be manufactured to have a reduced thickness, and may have price competitiveness because the fan-out package may be mounted on an electronic device without a separate substrate.

Hereinafter, a method of manufacturing an antenna module according to an exemplary embodiment will be described with reference to FIGS. 11A to 11F. Various features and advantages of an antenna module according to the present embodiment will be understood during description of the manufacturing method.

Figure 11A:
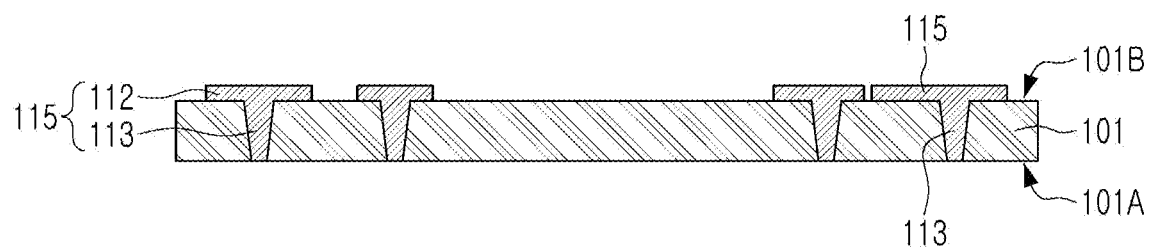
FIGS. 11A to 11F are cross-sectional views of main processes illustrating a method of manufacturing an antenna module according to an exemplary embodiment in the present disclosure.

Referring to FIG. 11A, a glass substrate 101 having first and second surfaces 101A and 101B disposed to oppose each other is prepared. A wiring structure 115 is formed on the glass substrate 101.

A first through-via 113 is formed in the second surface 101B of the glass substrate 101 to penetrate the glass substrate 101, and a wiring pattern 112 is formed on the second surface 101B of the glass substrate 101. The formation of the first through-via 113 may be performed using laser drilling and/or mechanical drilling. The wiring pattern 112 may be formed by performing a patterning process using a dry film or the like and filling a pattern using a plating process well known in the art. In a subsequent module manufacturing process, the glass substrate 101 used as an antenna substrate may be used as a carrier substrate to reduce the cost of materials and improve process efficiency.

Figure 11B:
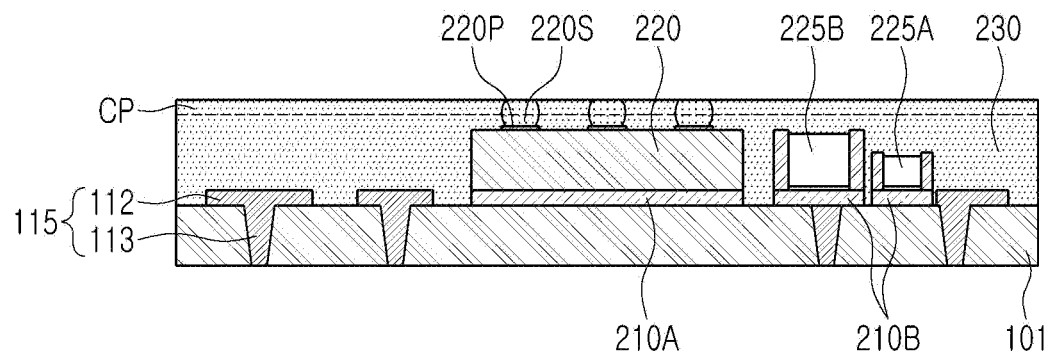

Referring to FIG. 11B, a semiconductor chip 220 and passive components 225A and 225B are disposed on the second surface 101A of the glass substrate 101, and an encapsulant 230 is formed to encapsulate the semiconductor chip 220 and the passive components 225A and 225B.

The steps of disposing the semiconductor chip 220 and the passive components 225A and 225B may be performed using first and second bonding layers 210A and 210B such as DAF, respectively. The first and second bonding layers 210A and 210B may bond the semiconductor chip 220 and the passive components 225A and 225B at desired positions on the second surface 101B of the glass substrate 101. In this case, the semiconductor chip 220 may be disposed in such a manner that an active surface, on which a connection pad 220P of the semiconductor chip 220 is formed, faces upwardly (for example, face-up). As described above, the glass substrate 101 may be used as a carrier substrate to form a semiconductor package, allowing an inactive surface of the semiconductor chip to be substantially coplanar with a bonded surface of the passive components 225A and 225B.

The encapsulant 230 may be disposed on the second surface 101B of the glass substrate 101 to encapsulate the semiconductor chip 220 and the passive components 225A and 225B. In the present embodiment, the encapsulant 230 may be formed using a method well known in the art. For example, the encapsulant 230 may be formed by laminating a precursor for the encapsulant 230 and curing the laminated precursor. Alternatively, the encapsulant 230 may be formed by applying a liquid resin for the encapsulant 230 and curing the applied liquid resin to encapsulate the semiconductor chip 220 and the passive components 225A and 225B. The semiconductor chip 220 adopted in the present embodiment may include a conductive bump 220S, formed on the connection pad 220P, having a constant height. In this process, the encapsulant 230 may be formed to cover the conductive bump 220S.

Figure 11C:
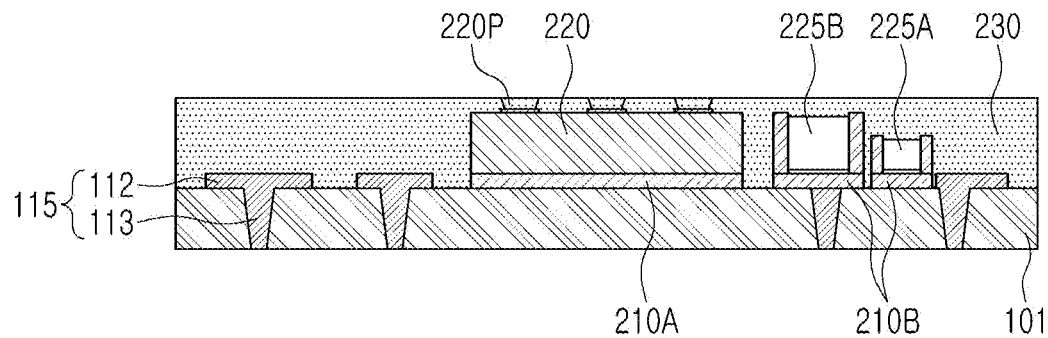

Referring to FIG. 11C, the encapsulant 230 may be polished to expose a surface of the conductive bump 220S.

A structure shown in FIG. 11C may be obtained by performing a polishing process on the encapsulant 230, shown in FIG. 11B, down to a CP line. The conductive bump 220S may be exposed by the polishing process to form a redistribution layer (for example, 245 in FIG. 11E) connected to the connection pad 220P of the semiconductor chip 220 in a subsequent process.

Figure 11D:
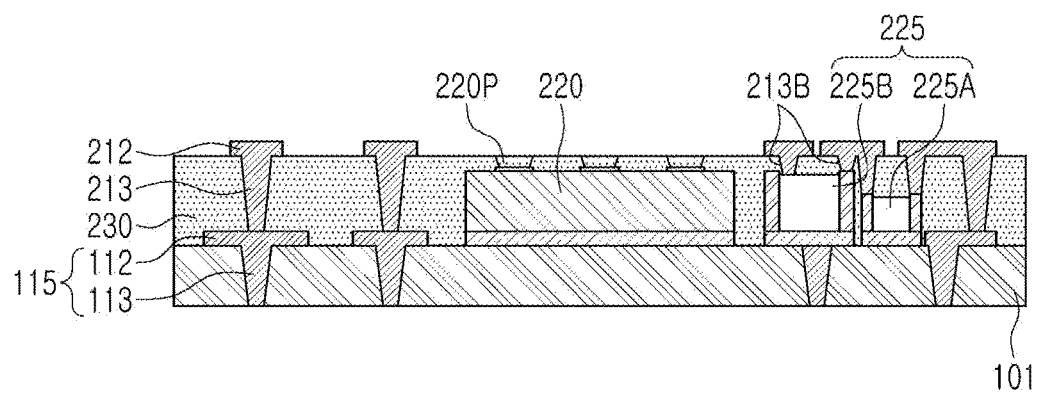

Referring to FIG. 11D, a second through-via 213 is formed to penetrate the encapsulant 230.

The second through-via 213 may be connected to the wiring pattern 112 disposed on the second surface 101B of the glass substrate 101. During the formation of the second through-via 213, a wiring pattern 212 disposed on the encapsulant 230 may also be formed. The wiring pattern 212 may be provided as a redistribution pattern constituting a redistribution layer to be formed in a subsequent process. The second through-via 213 and the wiring pattern 212 may be formed by forming a hole in a desired position in the encapsulant 230 using laser drilling and/or mechanical drilling, performing a patterning process using a dry film or the like, and performing a plating process well known in the art.

During the formation of the second through-via 243, a connection via may be formed to be connected to a passive component in an appropriate position in the encapsulant 230. Such connection vias 213A and 213B may also be formed in the process of forming the second through-via 213. For example, by adjusting laser output and/or time to vary via depth, the second through-via 213 and the connection vias 213A and 213B may be formed in desired positions.

Figure 11E:
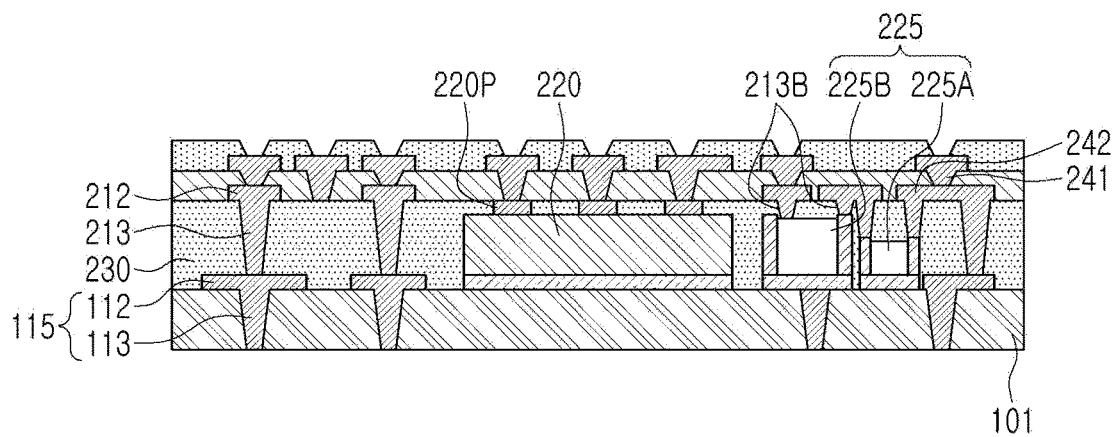

Referring to FIG. 11E, a connection member 240 is formed on a top surface of the encapsulant 230.

The formation of the connection member 240 may start from a step of forming an insulating layer 241 on the top surface of the encapsulant 230. The insulating layer 241 may be formed of various insulating materials. For example, the insulating layer 241 may include a thermosetting resin such as an epoxy resin and a thermoplastic resin such as polyimide. In a detailed example, the insulating layer 241 may include a photoimageable dielectric (PID) resin. A redistribution layer 245 including a redistribution via 243 and a redistribution pattern 242 may be formed by forming a hole connected to the connection pad 220P (in detail, the conductive pattern 220S and the wiring pattern 212) in the insulating layer 241, performing a patterning process using a dry film or the like, and performing a plating process well known in the art, as shown in FIG. 11E.

Figure 11F:
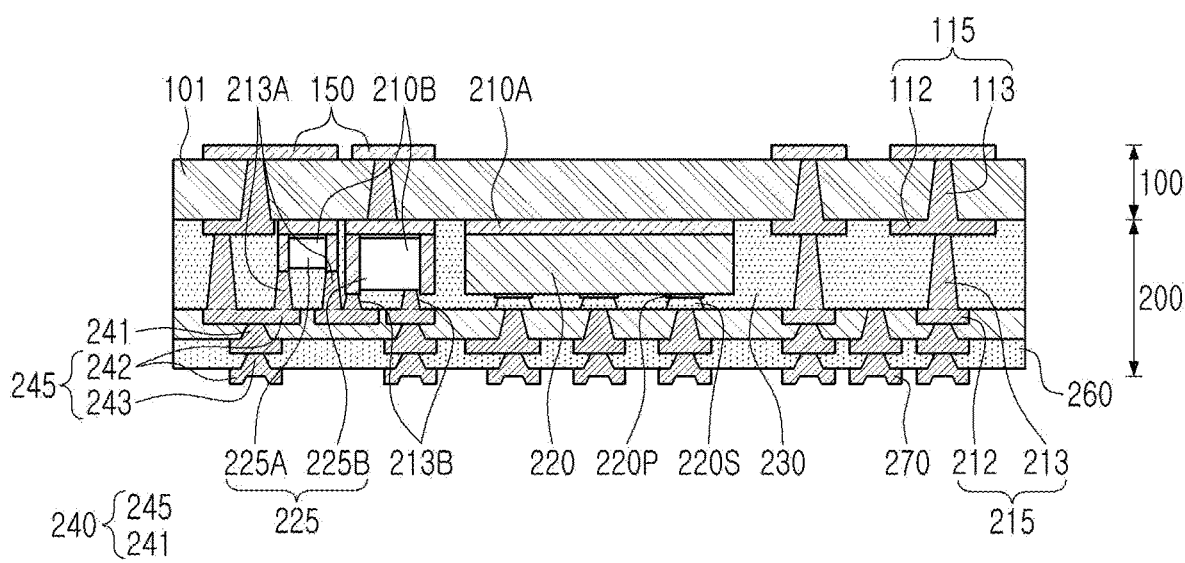

Referring to FIG. 11F, an antenna pattern 150 may be formed on the first surface 110A of the glass substrate 101.

As described in the present embodiment, the antenna pattern 150 may be formed on the first surface 101A of the glass substrate 101 after performing main processes of the semiconductor package. The antenna pattern 150 may have an array of a plurality of antenna patterns 150, as shown in FIG. 10B. For example, the antenna pattern 150 may include at least one of a dipole antenna and a patch antenna. A point in time, at which the antennal pattern 150 is formed, is not limited to the present embodiment. In another embodiment, the formation of the antenna pattern 150 may be performed in the process illustrated in FIG. 11A or in another process. A passivation layer 260 may be formed, and a UBM layer 270 and an electrical connection metal 280 connected to the redistribution layer 245 may be formed to manufacture the antenna module 300 illustrated in FIG. 9. The above-described processes may be performed in units of massive panels. After the above-described processes are completed, the panel may be singulated into individual semiconductor packages using a sawing process.

Embodiments in the present disclosure may be modified and implemented in various forms.

Figure 12:
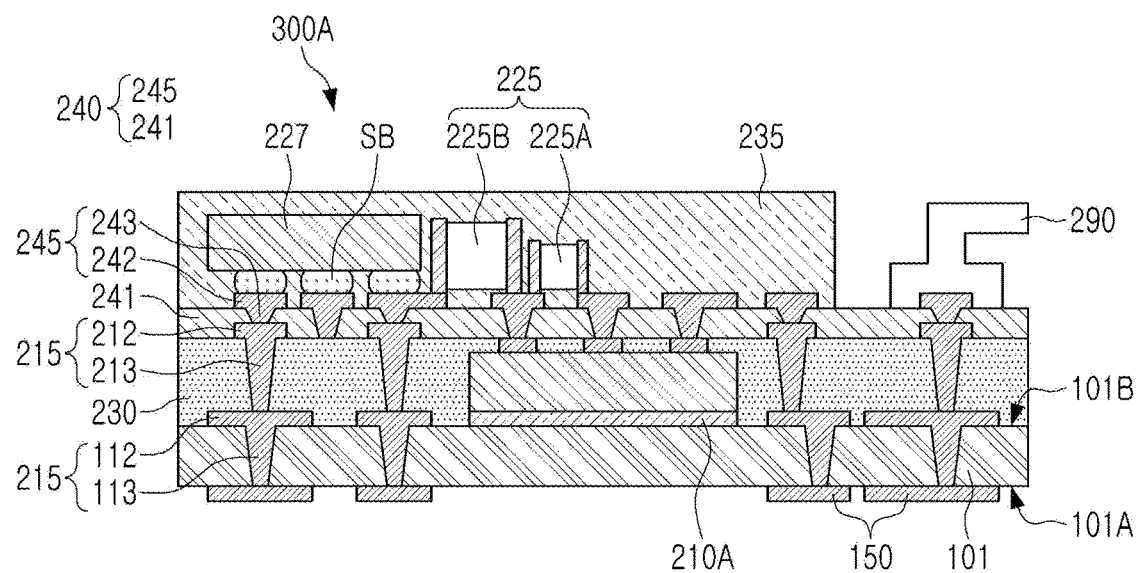
FIG. 12 is a schematic cross-sectional view illustrating an antenna module according to an exemplary embodiment in the present disclosure.
Figure 13:
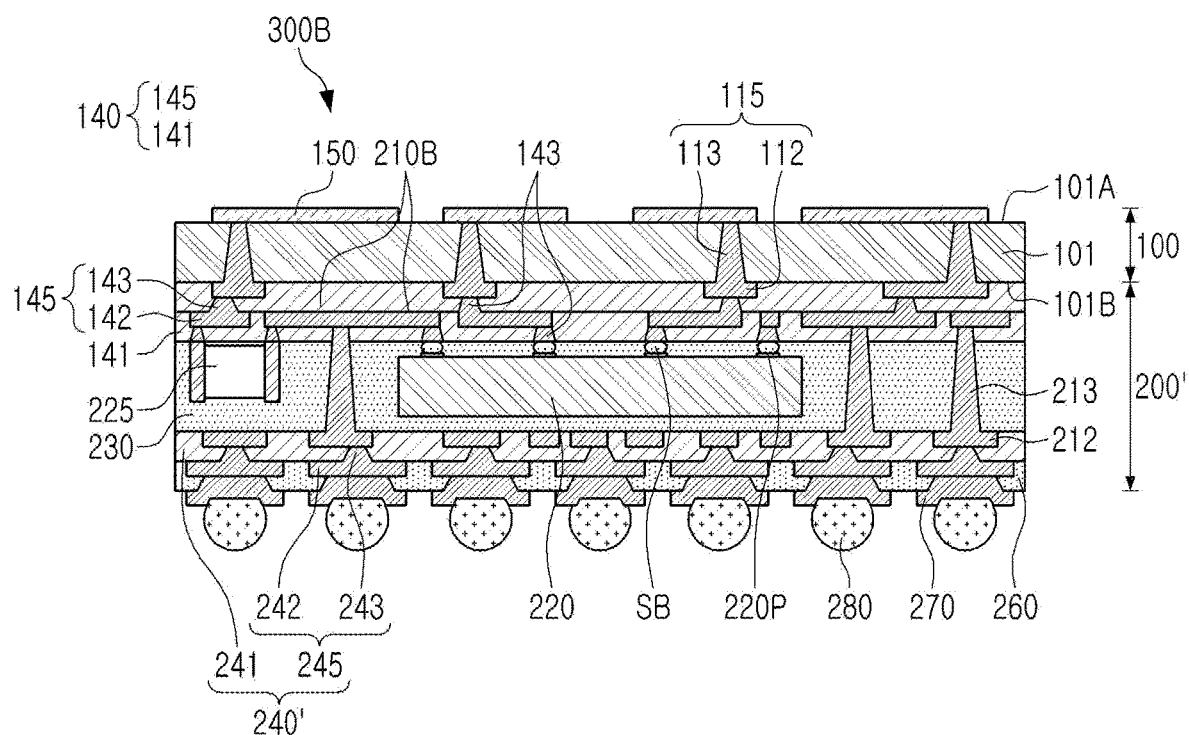
FIG. 13 is a schematic cross-sectional view illustrating an antenna module according to an exemplary embodiment in the present disclosure.

FIGS. 12 and 13 are schematic cross-sectional views illustrating antenna module according to various exemplary embodiments in the present disclosure, respectively.

Referring to FIG. 12, it will be appreciated that an antenna module 300A according to an exemplary embodiment has a similar structure to the structure illustrated in FIGS. 9 and 10A, expect for the arrangement of the passive components 225A and 225B and another electronic component 227 and the connection manner thereof to an external circuit. Components of the present embodiment may be understood with reference to the description of identical or similar components of the antenna module 300 illustrated in FIGS. 9 and 10A, unless an opposite or contradictory description is provided therein.

In the present disclosure, passive components 225*a* and 225B and another electronic component 227 may be disposed on a connection member 240 to be connected to a redistribution layer 245. The electronic component 227 may be an additional IC chip and may be connected to the redistribution layer 240 by a bump SB. A region, in which the passive components 225A and 225B and the electronic component 227 are disposed, may be encapsulated by an additional encapsulant 235. As shown in FIG. 12, the additional encapsulant 235 may be provided in such a manner that a portion of the connection member 240 is exposed, and a connector 290 may be formed on the exposed portion of the connection member 240 to be connected to an external circuit.

In a manner of mounting the passive components 225A and 225B such as a capacitor and the like, the present embodiment may be combined with the embodiment illustrated in FIG. 9. For example, some passive components or an electronic component may be disposed on the connection member 240, as described in the present embodiment, and other passive components or another electronic component may be disposed in the encapsulant 230, as illustrated in FIG. 9.

Referring to FIG. 13, it will be appreciated that an antenna module 300B according to an exemplary embodiment has a similar structure to the structure illustrated in FIGS. 9 and 10A, except for a first connection member 140 disposed between a substrate unit 100 and a semiconductor chip 220 and a manner of mounting the semiconductor chip 220 and a passive component 225. Components of the present embodiment may be understood with reference to the description of identical or similar components of the antenna module 300 illustrated in FIGS. 9 and 10A, unless an opposite or contradictory description is provided therein.

Similarly to the above-described embodiment, an antenna substrate 100 adopted in the present embodiment includes a glass substrate 101 having first and second surfaces 101A and 101B disposed to oppose each other. A wiring structure of the antenna substrate 100 may include an antenna pattern 112, disposed on the first surface 101A, a wiring pattern 112, disposed on the second surface 101B, and a first through-via 113 formed to connect the antenna pattern 150 and the wiring pattern 112 to each other.

Unlike the above-described embodiment, a semiconductor package 200' adopted in the present embodiment includes a first connection member 140 including a first redistribution layer 145, disposed on the second surface 101B of the glass substrate 101 and connected to the wiring pattern 112, and a semiconductor chip 220 including a connection pad 220P disposed on the first connection member 140 and connected to the first redistribution layer 145. Likewise, a first connection member 140 may be included between the antenna substrate 100 and the semiconductor chip 220. The first connection member 140 may include an insulating layer 141, on which the first redistribution layer 145 is implemented, and the first redistribution layer 145 may include a redistribution pattern 142 and a redistribution via 143. In the present embodiment, a connection pad 220P of the semiconductor chip 220 may be connected to the first redistribution layer 145 (in detail, the redistribution via 143) by a bump.

Since the glass substrate 101 may be used as a carrier substrate, the redistribution via 143 may be formed to have a smaller area as the redistribution via 143 gets closer to the glass substrate 101.

The semiconductor package 200' includes an encapsulant 230, disposed on the first connection member 140 to encapsulate the semiconductor chip 220, and a second connection member 240, disposed on the encapsulant 230, having a second redistribution layer 245. The first redistribution layer 145 and the second redistribution layer 245 may be connected by a second through-via 213 penetrating the encapsulant 230. More specifically, the second through-via may be connected to the second redistribution layer 240 by the wiring pattern 212 disposed on the encapsulant 230.

In the present embodiment, similarly to the embodiment illustrated in FIG. 9, the passive component 225 may be disposed on the second surface 101B of the glass substrate 101 and may be encapsulated by the encapsulant 230. The passive component 225 may be connected to at least one of the first and second redistribution layers 145 and 245. More specifically, the passive component 225 may be mounted to be connected to the first redistribution layer 145, as illustrated in FIG. 13. Alternatively, in the case in which the passive component 225 is connected to the second redistribution layer 245, the connection vias 213A and 213B shown in FIG. 9 may be additionally adopted.

Since the glass substrate 101 is used as a carrier substrate during manufacturing of an antenna module, the redistribution via 243 of the second redistribution layer 245 and/or the second through-via 213 may be formed to have a smaller area closer to the glass substrate 101, similarly to the redistribution via 143 of the first redistribution layer 145.

Hereinafter, a method of manufacturing the antenna module illustrated in FIG. 13 will be described with reference to FIGS. 14A to 14F. Various features and advantages of the antenna module 300B according to the present embodiment will be understood during description of the manufacturing method.

Figure 14A:
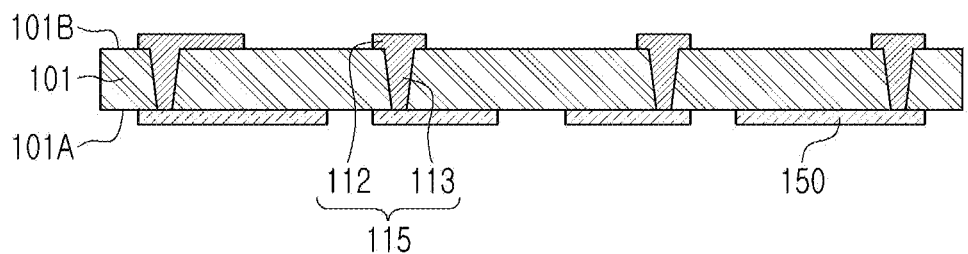
FIGS. 14A to 14F are cross-sectional views of main processes illustrating a method of manufacturing an antenna module according to an exemplary embodiment in the present disclosure.

Referring to FIG. 14A, a glass substrate 101 having first and second surfaces 101A and 101B disposed to oppose each other is prepared. A wiring structure 115 and an antenna pattern 150 are formed at the glass substrate 101.

Unlike the above-describe embodiment, in the method according to the present embodiment, a desired antenna pattern 150 may be formed in advance on the first surface 101A of the glass substrate 101 before forming a semiconductor package.

Figure 14B:
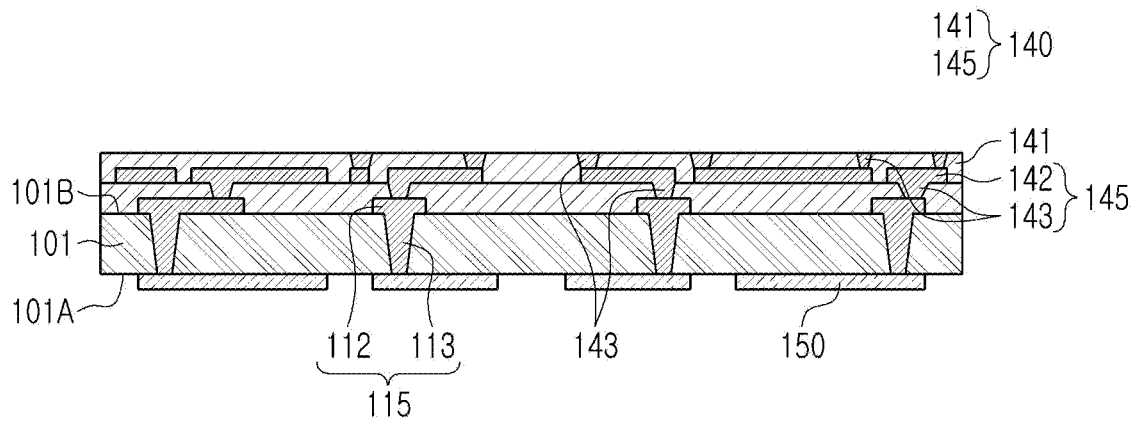

Referring to FIG. 14B, a first connection member 140 is formed on the second surface 101B of the glass substrate 101.

The formation of the first connection member 140 may start from a step of forming an insulating layer 141 on the second surface 101B of the glass substrate 101. The insulating layer 141 may be formed of various insulating materials. In a detailed example, the insulating layer 141 may include a photoimageable dielectric (PID) resin. A redistribution layer 145 may be formed by forming a hole in the wiring pattern 112 to be connected to the insulating layer 114, performing a patterning process using a dry film or the like, and performing a plating process well known in the art. In the present embodiment, additional processes of forming the insulating layer 141 and a redistribution via 143 may be repeatedly performed.

Figure 14C:
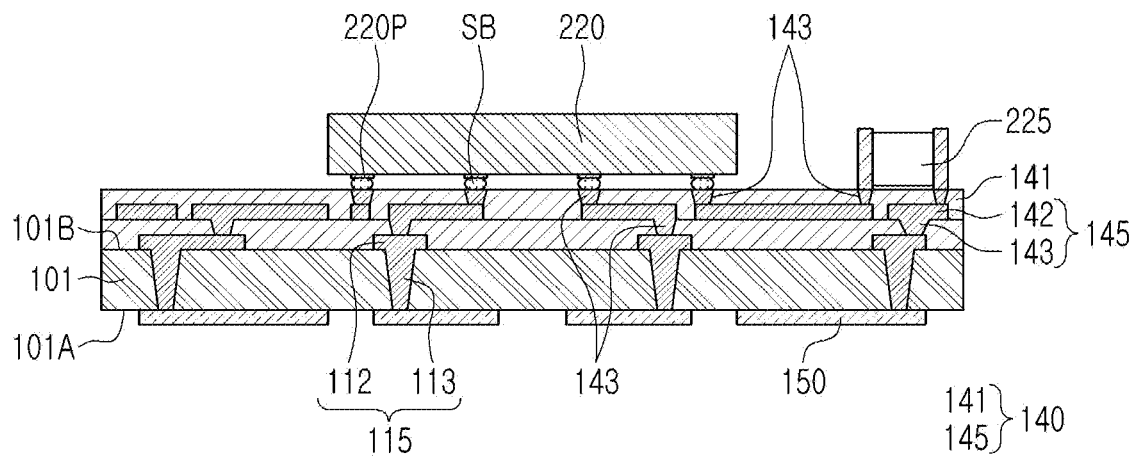

Referring to FIG. 14C, a semiconductor chip 220 and a passive component 225 are disposed on the first connection member 140.

In the present embodiment, the semiconductor chip 220 may be mounted to be connected to the first redistribution layer 145 using a bump SB. Likewise, the semiconductor chip 220 may be disposed in such a manner that an active surface, on which a connection pad 220P of the semiconductor chip 220 is formed, faces downward (for example, face-down). Similarly, the passive component 225 may also be mounted to be connected to the first redistribution layer 145. Portions of the semiconductor chip 220 and the passive component 225 may be connected to a second redistribution layer 245, formed in a subsequent process by a connection via, after being disposed on the first connection member 140 by a bonding layer (see FIGS. 11B and 11D).

Figure 14D:
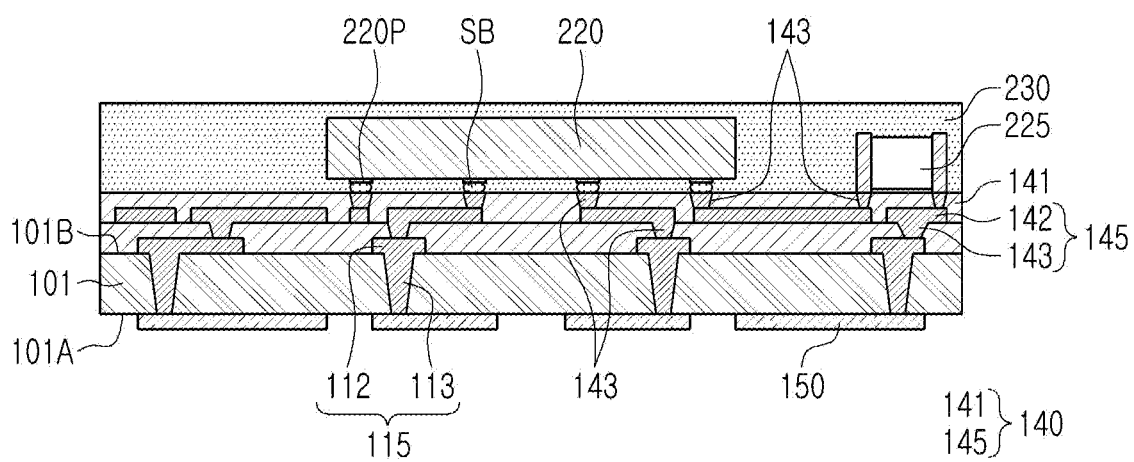

Referring to FIG. 14D, an encapsulant 230 may be formed to encapsulate the semiconductor chip 220 and the passive component 225.

The encapsulant 230 may be formed on the first connection member 140 to encapsulate the semiconductor chip 220 and the passive component 225. In the present embodiment, the encapsulant 230 may be formed using a method well known in the art, for example, by laminating a precursor for the encapsulant 230 and curing the laminated precursor. Alternatively, the encapsulant 230 may be formed by applying a liquid resin for the encapsulant 230 and curing the applied liquid resin to encapsulate the semiconductor chip 220 and the passive component 225.

Figure 14E:
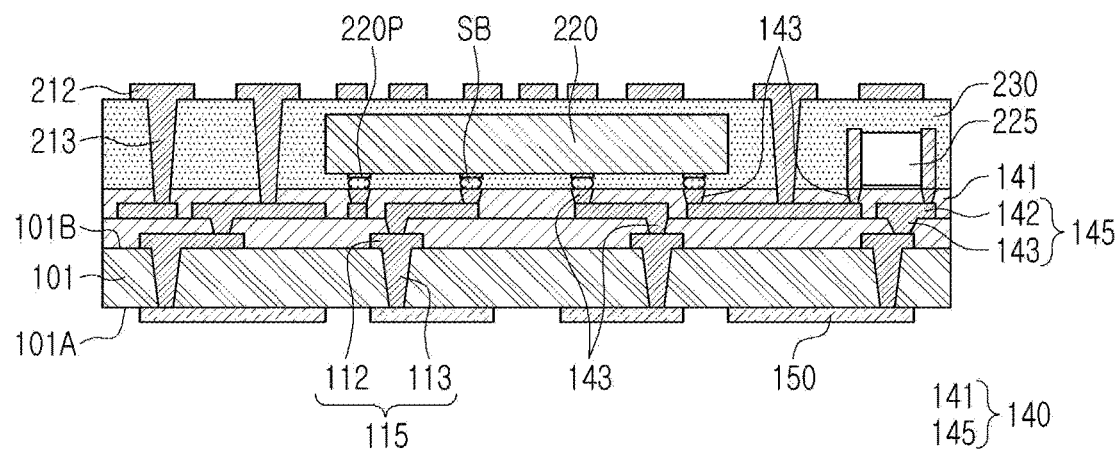

Referring to FIG. 14E, a second through-via is formed to penetrate the encapsulant 230.

The second through-via 213 may be formed to be connected to the first redistribution layer 145. A wiring pattern 212 may also be formed on a top surface of the encapsulant 230 during the formation of the second through-via 213. The wiring pattern 212 may be provided as a redistribution pattern constituting a redistribution layer to be formed in a subsequent process. The second through-via 213 and the wiring pattern 212 may be formed by forming a hole in a desired position in the encapsulant 230 using laser drilling and/or mechanical drilling, performing a patterning process using a dry film or the like, and performing a plating process well known in the art.

Figure 14F:
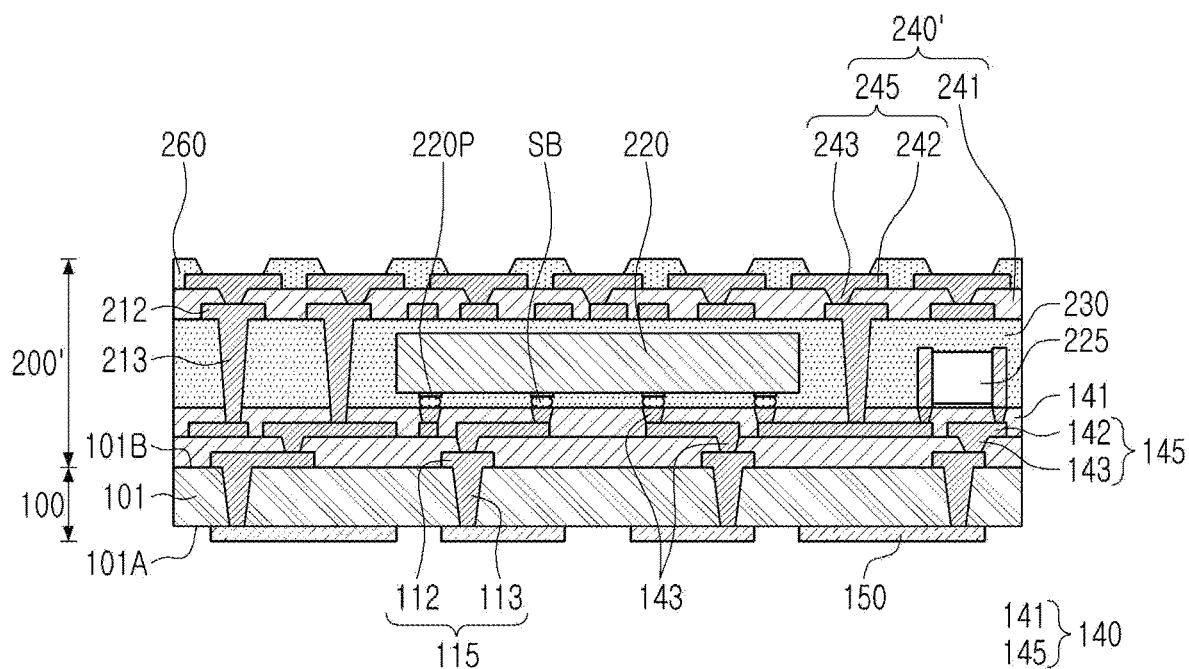

Referring to FIG. 14F, a second connection member 240' may be formed on a top surface of the encapsulant 230.

The formation of the second connection member 240' may start from a step of forming an insulating layer 241 on the top surface of the encapsulant 230. The insulating layer 241 may be formed of various insulating materials. For example, the insulating layer 241 may include a thermosetting resin such as an epoxy resin and a thermoplastic resin such as polyimide. In a detailed example, the insulating layer 241 may include a photoimageable dielectric (PID) resin. A second redistribution layer 245 including a redistribution via 243 and a redistribution pattern 242 may be formed by forming a hole connected to the wiring pattern 212 in the insulating layer 241, performing a patterning process using a dry film or the like, and performing a plating process well known in the art.

A passivation layer 260 may be formed, and a UBM layer 270 and an electrical connection metal 280 connected to the redistribution layer 245 may be formed to manufacture the antenna module 300 illustrated in FIG. 9. The above-described processes may be performed in units of large panels. After the above-described processes are completed, the panel may be singulated into individual semiconductor packages using a sawing process.

According to an exemplary embodiment, a glass substrate having a low-k dielectric constant $D_k$ and a low dielectric loss factor $D_f$ is used as an antenna substrate. Thus, transmission loss of an antenna module may be significantly reduced and transmission and reception rates may be improved. Moreover, since a surface of the glass substrate has a relatively low illuminance, loss caused by a skin effect may be reduced.

Moreover, since a glass substrate used as an antenna substrate may be used as a carrier substrate during a package manufacturing process, the cost of materials may be reduced and process efficiency may be improved.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to using the terms "first" and "second," the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

While exemplary embodiments have been shown and described above, it will be apparent to those skilled in the art that modifications and variations could be made without departing from the scope of the present invention as defined by the appended claims.

What is claimed is:

1. An antenna module comprising:
   an antenna substrate including a glass substrate having a first surface and a second surface opposing each other, an antenna pattern disposed on the first surface, a wiring pattern disposed on the second surface, and a first through-via connecting the antenna pattern and the wiring pattern to each other, wherein the first through-via has a smaller area as the first through-via gets closer to the first surface of the glass substrate;

at least one passive component disposed on the second surface of the glass substrate, and connected to at least one of a first and a second redistribution layers; and a semiconductor package disposed on the antenna substrate, wherein the semiconductor package comprises:

a first connection member disposed on the second surface of the glass substrate, and including the first redistribution layer connected to the wiring pattern, wherein the first redistribution layer includes a redistribution pattern and a redistribution via, and the redistribution via has a smaller area as the redistribution via gets closer to the glass substrate, a semiconductor chip disposed on the first connection member, and including a connection pad connected to the first redistribution layer, an encapsulant disposed on the first connection member and encapsulating the semiconductor chip and the at least one passive component, a second connection member disposed on the encapsulant, and including the second redistribution layer, and a second through-via penetrating the encapsulant and connecting the first redistribution layer and the second redistribution layer to each other, wherein the second through-via has a second smaller area as the second through-via gets closer to the first redistribution layer.

2. The antenna module of claim 1, wherein the at least one passive component is disposed adjacent to the second surface of the glass substrate.

* * * * *